(12) United States Patent
Haraguchi et al.

(10) Patent No.: US 7,964,475 B2
(45) Date of Patent: Jun. 21, 2011

(54) SEMICONDUCTOR WAFER, METHOD OF MANUFACTURING THE SAME AND SEMICONDUCTOR DEVICE

(75) Inventors: Yukiko Haraguchi, Fukuoka (JP); Takahiro Kumakawa, Kyoto (JP); Takashi Yui, Shiga (JP); Kazumi Watase, Fukui (JP)

(73) Assignee: Panasonic Corporation, Osaka (JP)

( * ) Notice: Subject to any disclaimer, the term of this patent is extended or adjusted under 35 U.S.C. 154(b) by 456 days.

(21) Appl. No.: 11/951,441

(22) Filed: Dec. 6, 2007

(65) Prior Publication Data
US 2008/0135975 A1    Jun. 12, 2008

(30) Foreign Application Priority Data

Dec. 11, 2006  (JP) ................................. 2006-332715

(51) Int. Cl.
*H01L 27/00* (2006.01)
*H01L 21/82* (2006.01)

(52) U.S. Cl. ................ 438/463; 438/798; 257/E27.001; 257/E21.602

(58) Field of Classification Search .................. 438/463, 438/798
See application file for complete search history.

(56) References Cited

FOREIGN PATENT DOCUMENTS
JP  2002-222777  8/2002

*Primary Examiner* — Alexander G Ghyka
(74) *Attorney, Agent, or Firm* — Steptoe & Johnson LLP

(57) ABSTRACT

A modified layer 5 and an altered layer 8 are formed outside a dicing point of a dicing area 3. Thus without forming another interface between different physical properties on the dicing point, it is possible to prevent chipping from progressing along a crystal orientation from an interface between a semiconductor element 2 and a semiconductor substrate 1 and from a surface of the semiconductor element during dicing, thereby suppressing the development of chipping to the semiconductor element.

20 Claims, 3 Drawing Sheets

SEMICONDUCTOR WAFER, METHOD OF MANUFACTURING THE SAME AND SEMICONDUCTOR DEVICE

FIELD OF THE INVENTION

The present invention relates to a semiconductor wafer, a method of manufacturing the same, and a semiconductor device whereby the semiconductor device is fabricated by dicing the semiconductor wafer.

BACKGROUND OF THE INVENTION

A number of semiconductor elements are formed on semiconductor substrates and blade dicing has been used as the most common technique of dividing semiconductor elements. Blade dicing is a cracking technique using a ring-shaped dicing saw rotated at high speed. Such a dicing saw is formed by bonding diamond or cubic boron nitride (CBN) particles with a bonding material. On the cut surfaces of semiconductor substrates made of brittle materials such as Si, cracks generally called chipping occur. In general, between semiconductor elements, a dividing area (dicing area) is formed as an area necessary for dividing the semiconductor elements. The width of the area is designed in consideration of a clearance equal to a chipping length in addition to a substantial width of cut made by a dicing saw. Further, in order to reduce chipping in dicing techniques using dicing saws, the quality of machining has been improved by improving and optimizing the specifications of dicing saws, that is, optimizing the grain size and density of diamond particles or bonding materials and so on, and improving and optimizing the conditions of equipment such as a rotation speed, a feed speed, and a depth of cut.

However, in recent years, improvements in the quality of machining using dicing saws have reached a limit. Particularly, as semiconductor processes support finer design rules, chipping is increasingly caused by brittle surface films, an increasing number of wiring layers, and so on. Thus there is a problem that chipping developing from a cut surface to a semiconductor element along a crystal orientation reaches the inside of the semiconductor element and adversely affects the characteristics of the semiconductor element.

In recent years, the configurations of dicing areas have been reexamined to reach a solution to this problem. For example, in a method of reducing chipping during cutting, a modified layer with degraded crystallinity is formed by one of plasma radiation, ion implantation, and laser radiation on a surface of a dicing area, and then dicing is performed on the modified layer.

Referring to FIG. 8, a conventional semiconductor wafer will be described below.

FIG. 8 is a sectional view showing a dicing area in the conventional semiconductor wafer.

In FIG. 8, reference numeral 1 denotes a semiconductor substrate, reference numeral 2 denotes a semiconductor element, reference numeral 3 denotes a dicing area (dividing area), reference numeral 4 denotes a semiconductor element effective area, reference numeral 5 denotes a crystal modified layer, and reference numeral 6 denotes a dicing cut point (dicing cut width). The plurality of semiconductor elements 2 are formed on the semiconductor substrate 1 to form the semiconductor wafer. The semiconductor wafer is divided into the semiconductor elements 2 by dicing to obtain semiconductor devices.

As shown in FIG. 8, the crystal modified layer 5 is formed on a surface of the semiconductor substrate 1 in the dicing area 3, and the dicing cut point 6 including the crystal modified layer 5 is cut off by dicing. Chipping normally occurs on an area where a large stress is applied to a machining point during dicing. Generally, an area where a large stress is applied to a machining point is an interface between materials having different physical properties. For example, when the wafer is made up of only the semiconductor substrate, the maximum stress is applied to the surface of the semiconductor substrate, that is, an interface between the air and the semiconductor substrate. In other words, in the conventional semiconductor wafer, by forming a layer with crystallinity degraded by plasma or ion implantation on the surface of the semiconductor substrate 1, that is, an area where the maximum stress is applied, it is possible to suppress chipping occurring along a crystal axis on the surface of the semiconductor substrate 1 during dicing.

DISCLOSURE OF THE INVENTION

However, in a conventional semiconductor wafer, a crystal modified layer is formed on a machining point for dicing. Thus another interface between different physical properties is formed between the crystal modified layer and an unmodified semiconductor substrate, so that chipping may occur due to a stress applied to the interface serving as a starting point of the stress.

Generally, in cutting such as blade dicing, as a configuration becomes complicated on a machining point of a work piece, the quality of machining tends to deteriorate. Thus it is preferable to minimize the number of stacked layers having different physical properties and the number of material components on a machining point of a work piece.

In order to solve the problem, an object of the present invention is to suppress the development of chipping during dicing and suppress the acceleration of chipping when a diced semiconductor chip is assembled.

In order to attain the object, a semiconductor wafer of the present invention includes a semiconductor substrate, a plurality of semiconductor elements formed in semiconductor lamination areas on the semiconductor substrate and divided by dicing areas, and at least a modified layer at least partially formed in the semiconductor substrate in the dicing area and near the semiconductor elements.

Further, the semiconductor lamination area in the dicing area has at least an altered layer near the semiconductor element.

Moreover, the modified layer is formed on both sides of a dicing point of the dicing area.

Further, the modified layer and the altered layer are formed on both sides of a dicing point of the dicing area.

Moreover, the modified layer is continuously formed in the depth direction to the back side of the semiconductor substrate.

Further, the modified layer and the altered layer are so formed as to be displaced from each other on a boundary of the layers.

Moreover, the semiconductor substrate in the dicing area has the modified layer for modifying the semiconductor substrate over the dicing area.

Further, the semiconductor lamination area in the dicing area has an altered layer for modifying the semiconductor lamination area over the dicing area.

A method of manufacturing a semiconductor wafer of the present invention includes the steps of: preparing a semiconductor substrate, forming a plurality of semiconductor elements divided by dicing areas, in semiconductor lamination areas on the semiconductor substrate and forming at least a modified layer at least partially in the semiconductor substrate in the dicing area and near the semiconductor elements by laser radiation.

Further, the method includes the step of forming at least an altered layer at least partially in the semiconductor lamination area in the dicing area and near the semiconductor elements by laser radiation.

Moreover, the plurality of modified layers having different depths are formed by emitting the laser radiation multiple times.

Further, the laser radiation is emitted from a formation surface of the semiconductor elements.

Moreover, the laser radiation is emitted from the back side of the semiconductor substrate.

Further, the modified layer and the altered layer are so formed as to be displaced from each other by emitting the laser radiation multiple times.

Moreover, the modified layer connecting to the back side of the semiconductor substrate is formed by continuously forming the modified layer.

Further, a semiconductor device of the present invention includes a semiconductor substrate and a semiconductor element formed in a semiconductor lamination area on the semiconductor substrate, the semiconductor device further including at least a modified layer at least partially formed in the semiconductor substrate under the outer periphery of the semiconductor element.

Further, the semiconductor device includes at least an altered layer at least partially formed in the semiconductor lamination area around the semiconductor element.

Moreover, the modified layer is continuously formed to the back side of the semiconductor substrate.

Further, the modified layer and the altered layer are so formed as to be displaced from each other.

DESCRIPTION OF THE EMBODIMENTS

The following will describe semiconductor wafers and methods of manufacturing the semiconductor wafers according to embodiments of the present invention with reference to the accompanying drawings.

Figure 1A:
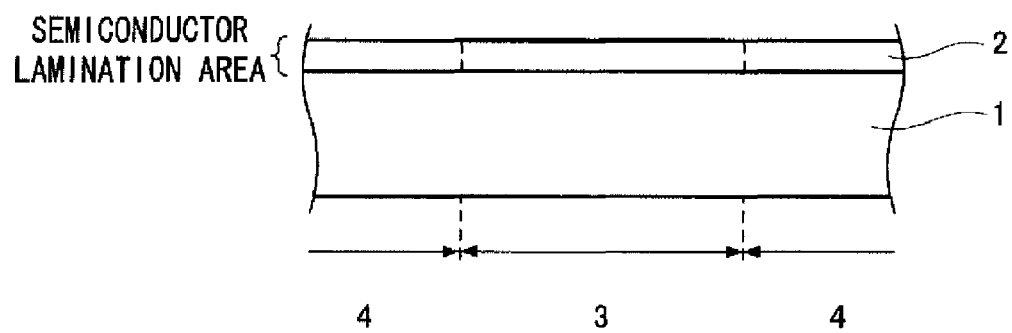
FIG. 1A is a process sectional view showing a method of manufacturing a semiconductor wafer according to a first embodiment.
Figure 1B:
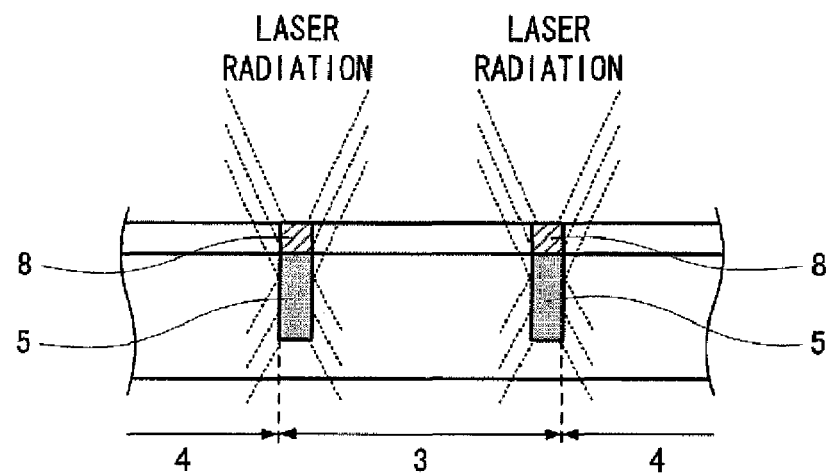
FIG. 1B is a process sectional view showing the method of manufacturing the semiconductor wafer according to the first embodiment.
Figure 1C:
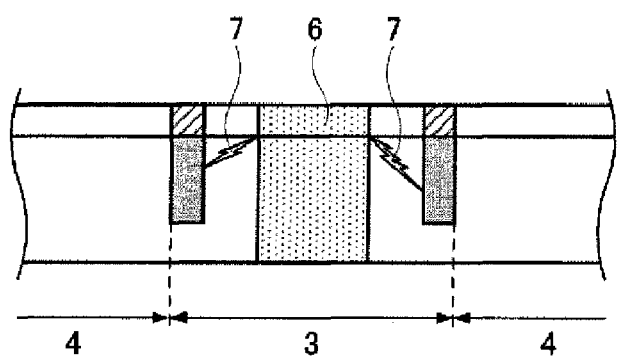
FIG. 1C is a process sectional view showing the method of manufacturing the semiconductor wafer according to the first embodiment.

FIGS. 1A, 1B and 1C are process sectional views showing a method of manufacturing a semiconductor wafer according to a first embodiment. FIG. 1C shows the configuration of the semiconductor wafer according to the first embodiment.

In FIGS. 1A, 1B and 1C, reference numeral 1 denotes a semiconductor substrate, reference numeral 2 denotes semiconductor elements, reference numeral 3 denotes a dicing area, reference numeral 4 denotes semiconductor element effective areas, reference numeral 5 denotes a crystal modified layer (hereinafter, will be referred to as a modified layer), reference numeral 6 denotes a dicing cut point (dicing width), reference numeral 7 denotes cracks (chipping), and reference numeral 8 denotes a semiconductor element altered layer (hereinafter, will be referred to as an altered layer). The plurality of semiconductor elements 2 are formed on the semiconductor substrate 1 to form the semiconductor wafer. The semiconductor wafer is divided into the semiconductor elements 2 by dicing to obtain semiconductor devices.

First, as shown in FIG. 1A, the semiconductor element 2 is formed in a semiconductor lamination area on the semiconductor substrate 1 made of a material typified by Si, GaAs, SiGe and so on.

Next, as shown in FIG. 1B, the modified layer 5 and the altered layer 8 with modified crystallinity are formed by laser radiation on both sides of the dicing area 3 and near the semiconductor element effective areas 4 so as not to come into contact with a cutting blade during cutting on the dicing area 3. The modified layer 5 is formed with crystallinity modified from the crystallinity of the semiconductor substrate 1. For example, in the case of a Si substrate, the modified layer 5 may be made of a material such as polycrystalline Si and amorphous Si and the modified layer 5 may be cracks and the like as long as the single crystal structure of the layer is broken. The altered layer 8 indicates a state in which the semiconductor elements on the semiconductor substrate 1 is carbonized, a state in which cracks occur, and a state in which melt has been solidified again. Although both of the modified layer 5 and the altered layer 8 are formed in FIG. 1, only the modified layer 5 may be formed. Further, although laser light is incident from a semiconductor element forming surface in FIG. 1, the laser light may be incident from the back side.

FIG. 1C shows a state in which the dicing area 3 has been cut by a dicing blade.

As shown in FIG. 1C, cutting with a dicing blade has to be performed without making contact with the modified layer 5 and the altered layer 8 which are formed in the dicing area.

In FIG. 1B and FIG. 1C, the modified layer 5 and the altered layer 8 are formed on both sides of the dicing cut point 6 but may be formed only on one side of the dicing cut point 6 when the dicing cut point 6 and the semiconductor element effective area 4 are separated from each other by a sufficient distance.

The modified layer 5 and the altered layer 8 are formed thus in a given peripheral area of the dicing cut point 6, thereby preventing the progress of chipping occurring on the dicing cut point 6 without forming another interface between different physical properties on the dicing cut point 6, that is, a starting point of chipping. Thus it is possible to suppress the development of chipping during dicing and prevent chipping from entering the semiconductor element effective area 4.

Moreover, according to the method of manufacturing the semiconductor wafer of the present invention, the semiconductor wafer is formed with a laser having a focal point of light in the semiconductor substrate after the semiconductor elements are formed, thereby eliminating the need for a mask unlike a semiconductor wafer formed by ion implantation or a process of diffusing plasma and the like. Thus, as a matter of course, any kind of semiconductor wafer can be freely processed in a planar direction regardless of the design, and the modified layer can be freely formed also in the depth direction. Further, laser radiation repeated multiple times makes it possible to form a plurality of modified layers in the depth direction and the planar direction.

Generally, the manufacture of a semiconductor wafer includes a back grinding process in which the thickness of a semiconductor wafer is reduced to a desired thickness by grinding the back side of the wafer. For example, laser radiation is emitted to a wafer having the original thickness with a strength obtained before back grinding, so that during laser radiation, the wafer can be transported and processed in a wafer state without using dicing tape having quite an uneven thickness. Thus it is possible to stabilize the height of laser machining.

Further, when a wafer processed with a laser is particularly deeply ground by back grinding, the wafer is divided into semiconductor elements from a modified layer serving as a starting point during grinding or transportation, so that a back grinder requires special transportation specifications including suction transportation over the surface of the wafer. Thus it is desirable to perform back grinding after laser machining.

Figure 2:
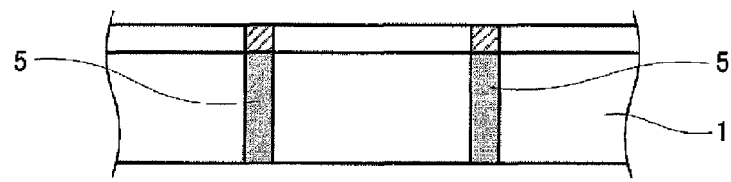
FIG. 2 is a sectional view showing the configuration of a semiconductor wafer according to a second embodiment.

FIG. 2 is a sectional view showing the configuration of a semiconductor wafer according to a second embodiment.

The second embodiment is different from the first embodiment of FIG. 1 in that a modified layer 5 is continuously formed in the depth direction of a semiconductor substrate 1. Particularly, in the embodiment of FIG. 2, the modified layer 5 is so formed as to penetrate the semiconductor substrate 1 to the back side of the semiconductor substrate 1. The modified layer 5 continuously formed thus in the depth direction can suppress chipping to a deeper position.

Figure 3:
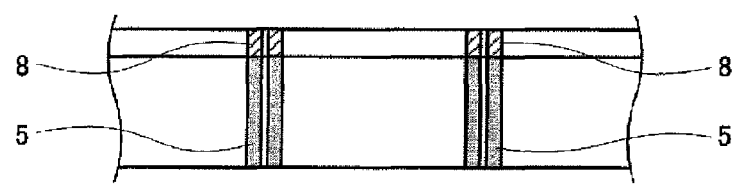
FIG. 3 is a sectional view showing the configuration of a semiconductor wafer according to a third embodiment.

FIG. 3 is a sectional view showing the configuration of a semiconductor wafer according to a third embodiment.

As shown in FIG. 3, in the third embodiment, a plurality of modified layers 5 and a plurality of altered layers 8 are formed to further increase capability of suppressing chipping.

Figure 4:
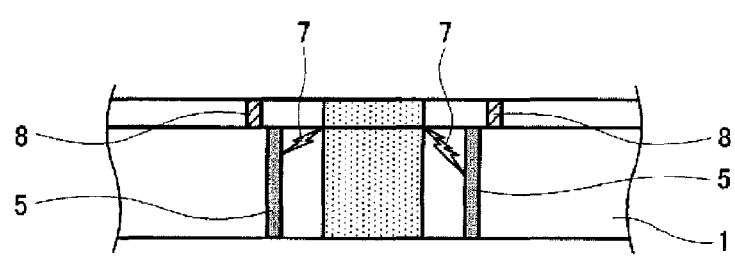
FIG. 4 is a sectional view showing the configuration of a semiconductor wafer in which a modified layer and an altered layer are displaced from each other according to a fourth embodiment.
Figure 5:
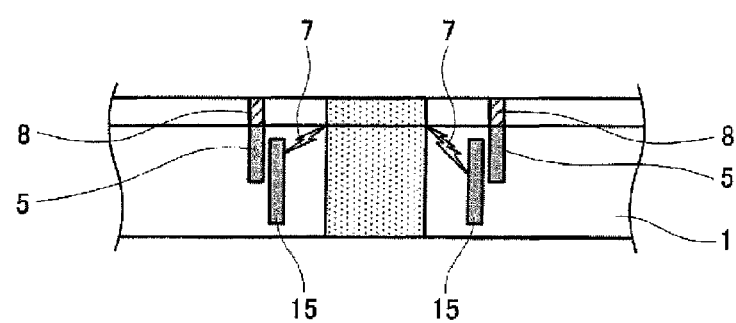
FIG. 5 is a sectional view showing the configuration of a semiconductor wafer in which only the number of modified layers is more than one according to the fourth embodiment.

FIGS. 4 and 5 are sectional views showing semiconductor wafers according to a fourth embodiment of the present invention.

FIG. 4 is a sectional view showing the configuration of the semiconductor wafer in which a modified layer 5 and an altered layer 8 are displaced from each other according to the fourth embodiment. FIG. 5 is a sectional view showing the configuration of the semiconductor wafer in which only the number of modified layers is more than one according to the fourth embodiment.

In the fourth embodiment of FIG. 4, the formation areas of the modified layer 5 and the altered layer 8 are displaced from each other. In FIG. 5, another modified layer 15 is provided between the modified layers 5 in the area of a semiconductor substrate 1, in the semiconductor wafer of the first embodiment. In FIG. 4, the modified layer 5 and the altered layer 8 may be partially brought into contact with each other. In FIG. 5, the modified layer 5 and the modified layer 15 may be partially brought into contact with each other. A step formed by the modified layer 5 and the modified layer 15 is disposed on a point where cracks 7 are likely to occur due to chipping. Thus the modified layers in two rows can further prevent the progress of chipping as compared with the first embodiment, and suppress an increase in laser radiation time unlike the third embodiment in which a laser radiation time is required for forming the multiple modified layers 5 and the multiple altered layers 8 without steps.

Figure 6:
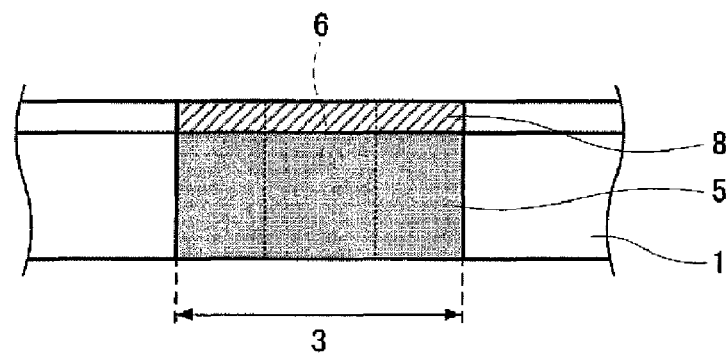
FIG. 6 is a sectional view showing the configuration of a semiconductor device according to a fifth embodiment.

FIG. 6 is a sectional view showing the configuration of a semiconductor wafer according to a fifth embodiment.

As shown in FIG. 6, a modified layer 5 and an altered layer 8 are formed over a dicing area 3 of a semiconductor substrate 1. Even in the event of chipping on an interface between the modified layer 5 and the altered layer 8, the chipping occurs in the modified layer 5 and the altered layer 8 which have degraded crystallinity, and thus the chipping hardly progresses. The modified layer 5 with a broken crystal structure is formed over a dicing cut point 6, so that chipping developed by crystallinity can be completely eliminated. In this case, both of the modified layer 5 and the altered layer 8 are formed over the dicing area 3. Only the modified layer 5 may be formed over the dicing area 3.

Figure 7:
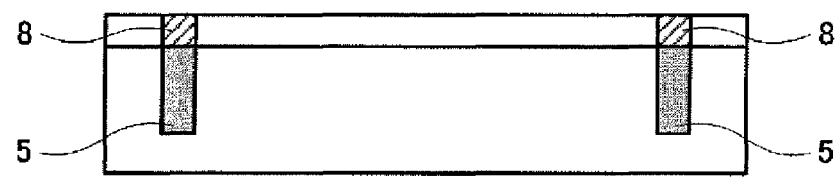
FIG. 7 is a sectional view showing the configuration of a semiconductor wafer according to a sixth embodiment.
Figure 8:
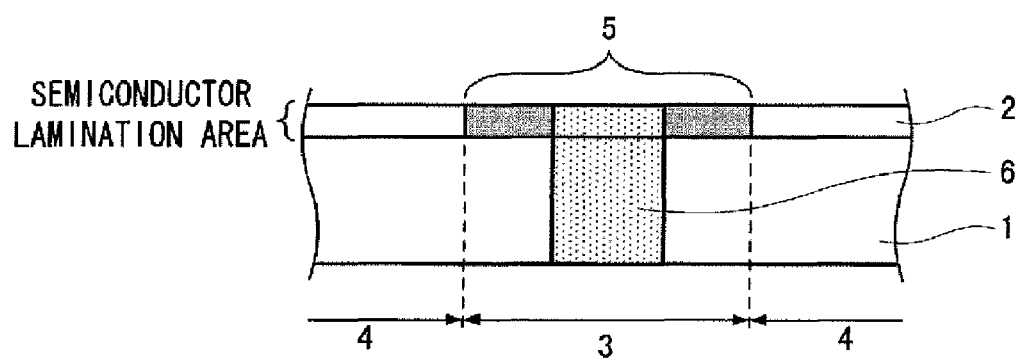
FIG. 8 is a sectional view showing a dicing area in a conventional semiconductor wafer.

FIG. 7 is a sectional view showing the configuration of a semiconductor device according to a sixth embodiment.

The semiconductor device of FIG. 7 is obtained by dicing the semiconductor wafer of FIG. 1. The semiconductor device includes a modified layer 5 and an altered layer 8 on the outer periphery. Since the modified layer 5 and the altered layer 8 are provided on the outer periphery of the semiconductor device, when the semiconductor device is picked up by a collet (not shown) and the like, it is possible to suppress the development of chipping caused by a stress applied to a portion making contact with the collet. FIG. 7 only illustrates the embodiment in which the semiconductor wafer of FIG. 1 is divided. As a matter of course, the semiconductor wafers of FIGS. 2 to 6 may be divided.

As described above, according to the semiconductor wafer of the present invention, a modified layer and an altered layer are formed outside a dicing point of a dicing area. Thus without forming another interface between different physical properties on the dicing point, it is possible to prevent chipping from progressing along a crystal orientation from an interface between a semiconductor element and a semiconductor substrate and from a surface of the semiconductor element during dicing, thereby suppressing the development of chipping to the semiconductor element.

What is claimed is:

1. A method of manufacturing a semiconductor device, comprising:
   preparing a semiconductor substrate;
   forming a semiconductor element on the semiconductor substrate;
   forming a dicing area in a peripheral area of the semiconductor element;
   forming in the dicing area at least a crystallinity modified layer in the depth direction of the semiconductor substrate; and
   dicing the semiconductor substrate in the dicing area by cutting at dicing cutting points spaced away from the crystallinity modified layer.

2. The method of manufacturing a semiconductor device according to claim 1, wherein the crystallinity modified layer is formed by laser radiation.

3. The method of manufacturing a semiconductor device according to claim 2, wherein the crystallinity modified layer is formed by multiple exposures to laser radiation.

4. The method of manufacturing a semiconductor device according to claim 2, further comprising forming at least an altered layer in the dicing area by laser radiation.

5. The method of manufacturing a semiconductor device according to claim 4, wherein the altered layer is carbonized.

6. The method of manufacturing a semiconductor device according to claim 4, wherein the altered layer is formed on the crystallinity modified layer.

7. The method of manufacturing a semiconductor device according to claim 2, wherein the crystallinity modified layer extends to a back surface of the semiconductor substrate.

8. The method of manufacturing a semiconductor device according to claim 2, wherein the laser radiation is emitted from a formation surface of the semiconductor element.

9. The method of manufacturing a semiconductor device according to claim 2, wherein the laser radiation is emitted toward a back surface of the semiconductor substrate.

10. A method of manufacturing a semiconductor device, comprising:
   preparing a semiconductor substrate;
   forming a semiconductor element on the semiconductor substrate;
   forming a dicing area in a peripheral area of the semiconductor element;
   forming in the dicing area at least two crystallinity modified layers in the depth direction of the semiconductor substrate; and
   dicing the semiconductor substrate in the dicing area between the two crystallinity modified layers.

11. The method of manufacturing a semiconductor device according to claim 10, wherein the crystallinity modified layer is formed by laser radiation.

12. The method of manufacturing a semiconductor device according to claim 11, wherein the crystallinity modified layer is formed by multiple exposures to laser radiation.

13. The method of manufacturing a semiconductor device according to claim 11, further comprising forming at least an altered layer in the dicing area by laser radiation.

14. The method of manufacturing a semiconductor device according to claim 13, wherein the altered layer is carbonized.

15. The method of manufacturing a semiconductor device according to claim 13, wherein the altered layer is formed on the crystallinity modified layer.

16. The method of manufacturing a semiconductor device according to claim 11, wherein two crystallinity modified layers are formed in the dicing area.

17. The method of manufacturing a semiconductor device according to claim 16, wherein the two crystallinity modified layers are formed to different depths in the substrate.

18. The method of manufacturing a semiconductor device according to claim 11, wherein the crystallinity modified layers extend to a back surface of the semiconductor substrate.

19. The method of manufacturing a semiconductor device according to claim 11, wherein the laser radiation is emitted from a formation surface of the semiconductor element.

20. The method of manufacturing a semiconductor device according to claim 11, wherein the laser radiation is emitted toward a back surface of the semiconductor substrate.

* * * * *